(12) United States Patent
de Raad et al.

(10) Patent No.: US 10,826,290 B2
(45) Date of Patent: Nov. 3, 2020

(54) ELECTROSTATIC DISCHARGE (ESD) PROTECTION FOR USE WITH AN INTERNAL FLOATING ESD RAIL

(71) Applicant: NXP B.V., Eindhoven (NL)

(72) Inventors: Gijs Jan de Raad, Bemmel (NL); Madan Mohan Reddy Vemula, Tempe, AZ (US)

(73) Assignee: NXP B.V., Eindhoven (NL)

( * ) Notice: Subject to any disclaimer, the term of this patent is extended or adjusted under 35 U.S.C. 154(b) by 344 days.

(21) Appl. No.: 15/390,037

(22) Filed: Dec. 23, 2016

(65) Prior Publication Data

US 2018/0183233 A1  Jun. 28, 2018

(51) Int. Cl.
*H02H 9/00* (2006.01)
*H02H 9/04* (2006.01)
*H01L 27/02* (2006.01)

(52) U.S. Cl.
CPC ......... *H02H 9/041* (2013.01); *H01L 27/0292* (2013.01); *H02H 9/046* (2013.01)

(58) Field of Classification Search
USPC .......................................................... 361/56
See application file for complete search history.

(56) References Cited

U.S. PATENT DOCUMENTS

| | | | |
|---|---|---|---|
| 6,671,153 B1 | 12/2003 | Ker et al. | |
| 6,724,603 B2* | 4/2004 | Miller | H01L 27/0251 |
| | | | 361/111 |
| 7,098,511 B2 | 8/2006 | Ker et al. | |
| 7,508,639 B2 | 3/2009 | Wu et al. | |
| 7,656,627 B2 | 2/2010 | Ker et al. | |

(Continued)

FOREIGN PATENT DOCUMENTS

CN    101626154 A    1/2010

OTHER PUBLICATIONS

U.S. Appl. No. 16/677,221, filed Nov. 7, 2019, and entitled "Apparatus for Suppressing Parasitic Leakage from I/O-Pins to Substrate in Floating-Rail EST Protection Networks".

*Primary Examiner* — Stephen W Jackson (57) ABSTRACT

Embodiments of an electrostatic discharge (ESD) protection device and a method of operating an ESD protection device are described. In one embodiment, the ESD protection circuit is connected between a $V_{DD}$ rail and a $V_{SS}$ rail and includes an internal floating ESD rail located between the $V_{DD}$ rail and the $V_{SS}$ rail, I/O pins connected between the internal floating ESD rail and the $V_{SS}$ rail, ESD diodes corresponding to at least one I/O pin, an internal bias cell corresponding to an I/O pin and configured to short the corresponding I/O pin to the internal floating ESD rail when the I/O pin is pulled high, and an internal bias cell corresponding to a $V_{DD}$ pin of the $V_{DD}$ rail and configured to short the $V_{DD}$ rail to the internal floating ESD rail when the $V_{DD}$ pin is pulled high.

22 Claims, 6 Drawing Sheets

(56) References Cited

U.S. PATENT DOCUMENTS

| | | |
|---|---|---|
| 7,889,470 B2 | 2/2011 | Ker et al. |
| 9,030,790 B1 | 5/2015 | Tanase |
| 9,298,238 B2 | 3/2016 | Mann et al. |
| 9,466,599 B2 | 10/2016 | Nair |
| 2005/0174707 A1* | 8/2005 | Ker .................... H01L 27/0251 361/56 |
| 2006/0092591 A1* | 5/2006 | Yuan ................... H01L 27/0251 361/91.1 |
| 2007/0058307 A1* | 3/2007 | Mergens ............. H01L 27/0262 361/56 |
| 2007/0091521 A1 | 4/2007 | Hsueh et al. |
| 2009/0021872 A1 | 1/2009 | Ker et al. |
| 2012/0002334 A1 | 1/2012 | Kosonocky et al. |
| 2012/0154962 A1* | 6/2012 | Russ ...................... H02H 9/046 361/56 |
| 2014/0376135 A1 | 12/2014 | Huo et al. |
| 2015/0194417 A1 | 7/2015 | Smith |
| 2015/0263505 A1* | 9/2015 | Takada ................... H02H 9/046 361/56 |
| 2016/0218503 A1 | 7/2016 | La Rosa et al. |
| 2018/0183233 A1 | 6/2018 | De Raad |

* cited by examiner

ELECTROSTATIC DISCHARGE (ESD) PROTECTION FOR USE WITH AN INTERNAL FLOATING ESD RAIL

Embodiments of the invention relate generally to electrostatic discharge (ESD) protection, and, more particularly, to ESD protection for use with an internal floating ESD rail.

An ESD protection circuit can be integrated onto an integrated circuit device to provide a low impedance channel to ground to prevent thermal damage in the integrated circuit device. A common ESD protection circuit uses a rail clamp to protect against an ESD strike. In combination with diodes, a rail clamp can also be used to protect non-supply pins such as input pins, output pins, or combined input/output pins.

SUMMARY

Embodiments of an electrostatic discharge (ESD) protection device and a method of operating an ESD protection device are described. In one embodiment, the ESD protection circuit is connected between a $V_{DD}$ rail and a $V_{SS}$ rail and includes an internal floating ESD rail located between the $V_{DD}$ rail and the $V_{SS}$ rail, I/O pins connected between the internal floating ESD rail and the $V_{SS}$ rail, ESD diodes corresponding to at least one I/O pin, with a first ESD diode located between the I/O pin and the internal floating ESD rail and a second ESD diode located between the I/O pin and the $V_{SS}$ rail, an internal bias cell corresponding to an I/O pin and configured to short the corresponding I/O pin to the internal floating ESD rail when the I/O pin is pulled high, and an internal bias cell corresponding to a $V_{DD}$ pin of the $V_{DD}$ rail and configured to short the $V_{DD}$ rail to the internal floating ESD rail when the $V_{DD}$ pin is pulled high.

In an embodiment, the internal bias cell corresponding to an I/O pin comprises a transistor connected between the I/O pin and the internal floating ESD rail.

In an embodiment, the internal bias cell corresponding to an I/O pin comprises an inverter having an input connected to the I/O pin and an output connected to the gate of the transistor.

In an embodiment, the inverter is connected between the internal floating ESD rail and the $V_{SS}$ rail.

In an embodiment, the transistor comprises a pMOS transistor and the inverter comprises an nMOS transistor and a pMOS transistor.

In an embodiment, the internal bias cell corresponding to the $V_{DD}$ pin comprises a transistor connected between the $V_{DD}$ rail and the internal floating ESD rail.

In an embodiment, the internal bias cell corresponding to the $V_{DD}$ pin comprises an inverter having an input connected to the $V_{DD}$ pin and an output connected to the gate of the transistor.

In an embodiment, the inverter is connected between the internal floating ESD rail and the $V_{SS}$ rail.

In an embodiment, the transistor comprises a pMOS transistor and the inverter comprises an nMOS transistor and a pMOS transistor.

In an embodiment, the internal bias cell corresponding to an I/O pin comprises a transistor connected between the I/O pin and the internal floating ESD rail and wherein the internal bias cell corresponding to the $V_{DD}$ pin comprises a transistor connected between the $V_{DD}$ rail and the internal floating ESD rail.

In an embodiment, the internal bias cell corresponding to an I/O pin comprises an inverter having an input connected to the I/O pin and an output connected to the gate of the transistor and wherein the internal bias cell corresponding to the $V_{DD}$ pin comprises an inverter having an input connected to the $V_{DD}$ pin and an output connected to the gate of the transistor.

In an embodiment, the inverter of the internal bias cell corresponding to an I/O pin is connected between the internal floating ESD rail and the $V_{SS}$ rail and wherein the inverter of the internal bias cell corresponding to the $V_{DD}$ pin is connected between the internal floating ESD rail and the $V_{SS}$ rail.

In an embodiment, within the internal bias cell corresponding to an I/O pin, the transistor comprises a pMOS transistor and the inverter comprises an nMOS transistor and a pMOS transistor and within the internal bias cell corresponding to the $V_{DD}$ pin, the transistor comprises a pMOS transistor and the inverter comprises an nMOS transistor and a pMOS transistor.

An embodiment of a method for providing ESD protection in a circuit that includes a $V_{DD}$ rail and a $V_{SS}$ rail is disclosed. The method involves, shorting an I/O pin to an internal floating ESD rail when the I/O pin is pulled high, wherein the internal floating ESD rail is located between the $V_{DD}$ rail and the $V_{SS}$ rail and wherein a first ESD diode is located between the I/O pin and the internal floating ESD rail and a second ESD diode is located between the I/O pin and the $V_{SS}$ rail, and shorting a $V_{DD}$ rail to the internal floating ESD rail when a $V_{DD}$ pin connected to the $V_{DD}$ rail is pulled high.

In an embodiment of the method, shorting an I/O pin to the internal floating ESD rail when the I/O pin is pulled high comprises pulling down the gate of a transistor connected between the I/O pin and the internal floating ESD rail.

In an embodiment of the method, shorting the I/O pin to the internal floating ESD rail when the I/O pin is pulled high comprises pulling an input of an inverter high, wherein the input is connected to the I/O pin and an output of the inverter is connected to the gate of the transistor.

In an embodiment of the method, shorting the $V_{DD}$ rail to the internal floating ESD rail when the $V_{DD}$ pin is pulled high comprises pulling down the gate of a transistor connected between the $V_{DD}$ rail and the internal floating ESD rail.

In an embodiment of the method, shorting $V_{DD}$ rail to the internal floating ESD rail when the VDD pin is pulled high comprises pulling an input of an inverter high, wherein the input is connected to the $V_{DD}$ pin and an output of the inverter is connected to the gate of the transistor.

In an embodiment of the method, shorting an I/O pin to the internal floating ESD rail when the I/O pin is pulled high comprises pulling an input of an inverter high, wherein the input is connected to the I/O pin and an output of the inverter is connected to the gate of a transistor that is connected between the I/O pin and the internal floating ESD rail and pulling down the gate of the transistor, and shorting the VDD rail to the internal floating ESD rail when the $V_{DD}$ pin is pulled high comprises pulling an input of an inverter high, wherein the input is connected to the $V_{DD}$ pin and an output of the inverter is connected to the gate of a transistor that is connected between the $V_{DD}$ rail and the internal floating ESD rail and pulling down the gate of the transistor.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
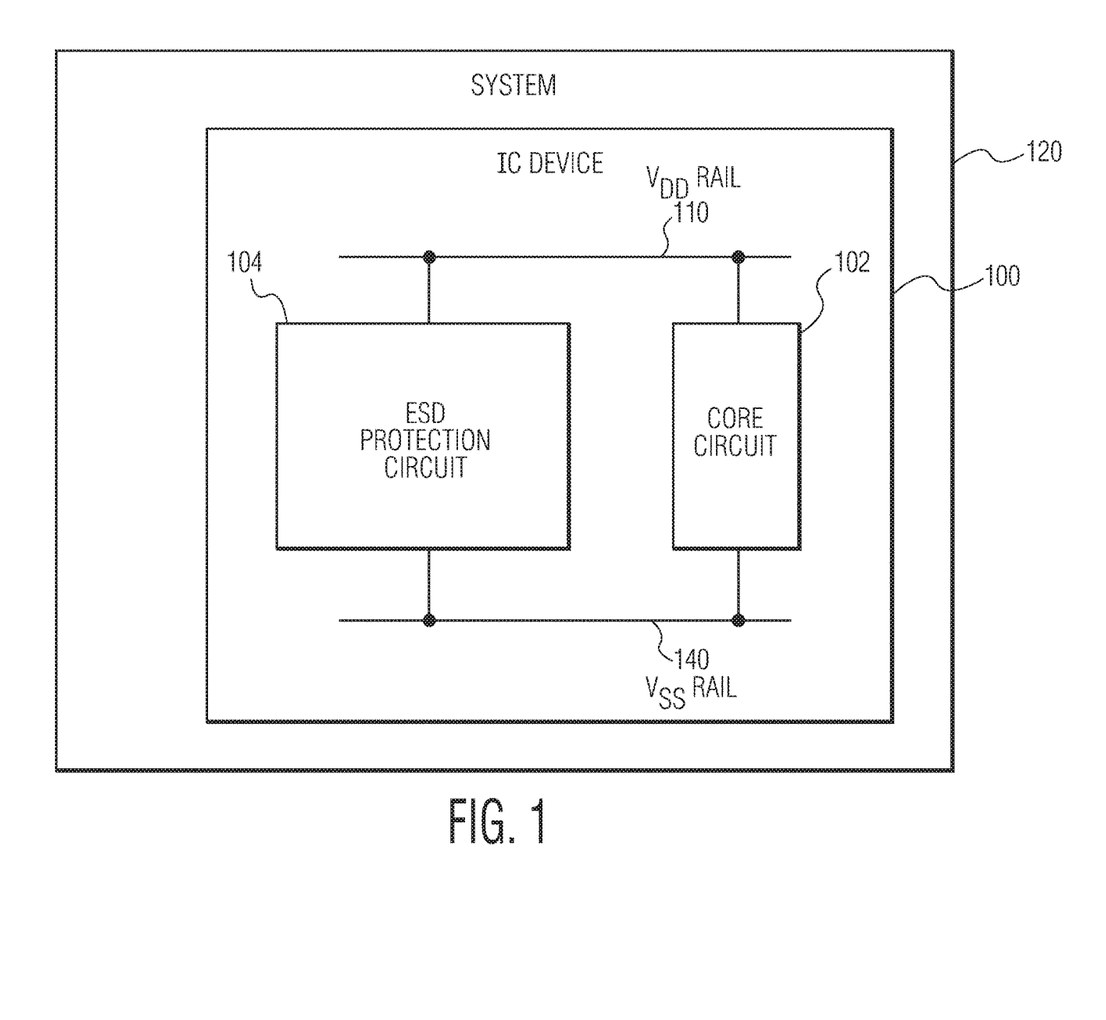
FIG. 1 is a schematic block diagram of a system that includes an ESD protection circuit.

FIG. 1 is a block diagram of a system 120 that includes an ESD protection circuit. The system can be used in various applications, such as automotive applications, communications applications, industrial applications, medical applications, computer applications, and/or consumer or appliance applications. In the embodiment depicted in FIG. 1, the system includes an integrated circuit (IC) device 100, which includes a core circuit 102 and an ESD protection circuit 104 that is used to protect the core circuit during an ESD event, which may be an ESD test or an actual ESD strike. The IC device can be embodied in a substrate, such as a semiconductor substrate or a printed circuit board (PCB). In an embodiment, the IC device is packaged as a semiconductor IC chip and may be included in a microcontroller, which can be used for in-vehicle control or communications, identification, wireless communications, and/or lighting control. In some embodiments, the IC device is included in a system such as a smartphone, a tablet computer, a laptop, etc. For example, the IC device may be included in a system that is configured to communicate via Near Field Communications (NFC).

The core circuit 102 is a device to be protected by the ESD protection circuit 104 in case of an ESD event. The core circuit typically includes one or more internal circuit components such as transistors and diodes that are susceptible to an ESD strike. Examples of the core circuit include, but are not limited to, microcontrollers, transceivers, and switching circuits. In an embodiment, the core circuit is connected to a power supply domain. For example, the core circuit may be connected between a power supply rail 110 with a supply voltage, "$V_{DD}$," (referred to herein as the "$V_{DD}$ rail") and a voltage rail 140 with a lower voltage, "$V_{SS}$," (referred to herein as the "$V_{SS}$ rail"), which may be ground. Although the IC device is shown in FIG. 1 as including the core circuit and the ESD protection circuit, in other embodiments, the IC device may include additional circuit elements.

The ESD protection circuit 104 protects the core circuit 102 during an ESD event. As shown in FIG. 1, the ESD protection circuit 104 is connected between the $V_{DD}$ rail 110 and the $V_{SS}$ rail 140 of the IC device 100. In the embodiment depicted in FIG. 1, the ESD protection circuit may include a rail clamp, which is configured to conduct current during an ESD event. For example, the rail clamp may include a "bigFET" that protects the power supply domain of the IC device 100 from overvoltage during an ESD event by shunting the ESD current from the power supply domain to the ground domain (i.e., the ground). Rail clamps are known in the field of ESD protection circuits. The ESD protection circuit may also include serially connected ESD diodes that are coupled in parallel with the core circuit to restrict current flow and to provide voltage surge protection.

Figure 2:
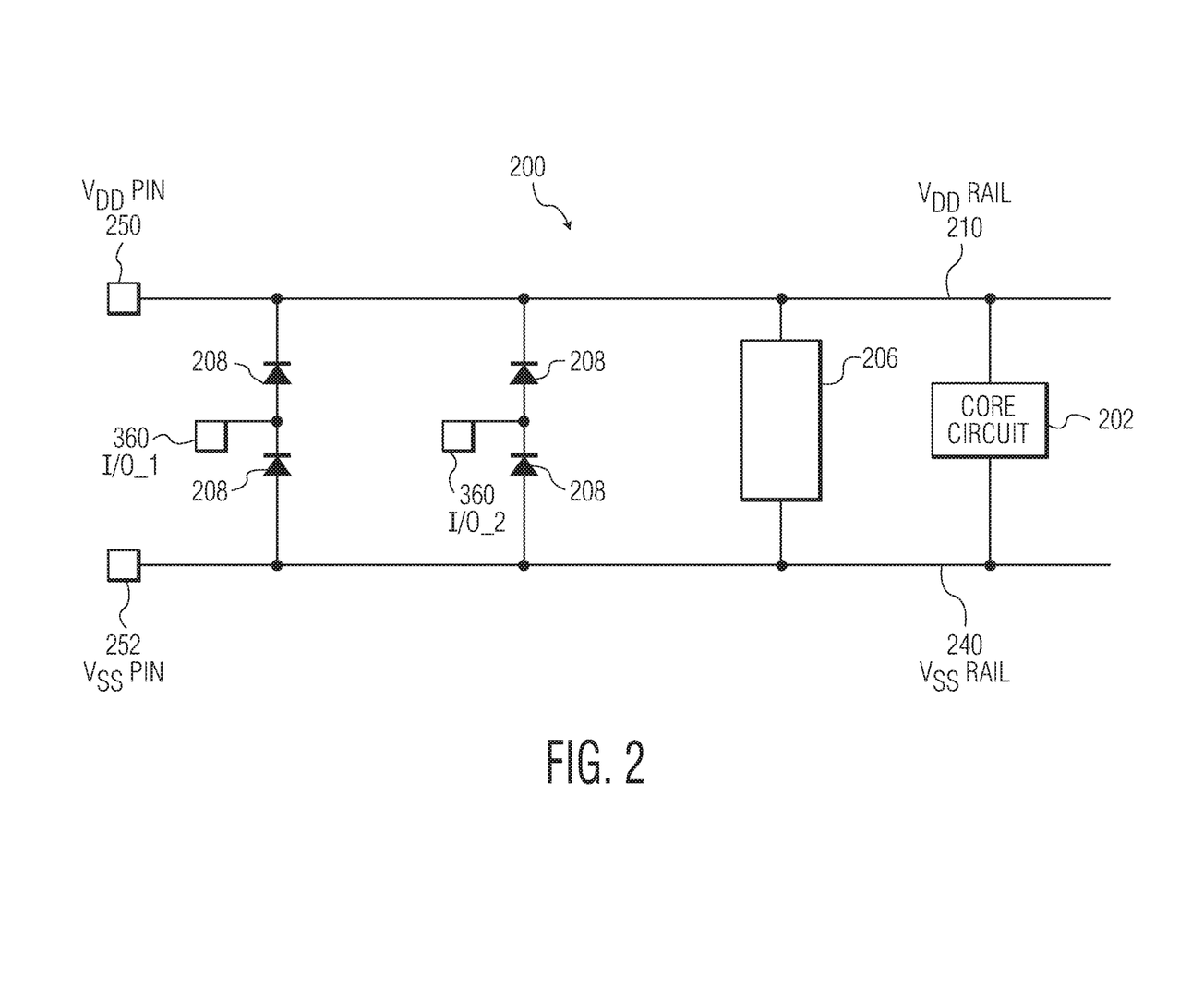
FIG. 2 depicts an example embodiment of a rail-based ESD protection network that can be used in the system of FIG. 1.

FIG. 2 depicts an example embodiment of a rail-based ESD protection network 200 that can be used in the system 120 of FIG. 1. The ESD protection network of FIG. 2 includes a rail clamp 206 and ESD diodes 208 that are located between the $V_{DD}$ rail 210 and the $V_{SS}$ rail 240 to protect the core circuit 202 from ESD events. In this example, the $V_{DD}$ rail functions as both the $V_{DD}$ rail and as an ESD protection rail. As shown in FIG. 2, the system includes a $V_{DD}$ pin 250, a $V_{SS}$ pin 252, and two input/output (I/O) pins 360 (identified as I/O_1 and I/O_2). It should be understood that although two I/O pins are shown in FIG. 2, there could be only one I/O pin or there could be more than two I/O pins depending on the implementation. In the example of FIG. 2, each I/O pin is connected between two serially connected ESD diodes 208 and the $V_{DD}$ pin is also connected between two serially connected ESD diodes. In an embodiment, the ESD diodes are p+ (pplus) in n-well diodes as is known in the field of ESD protection circuits.

Figure 3:
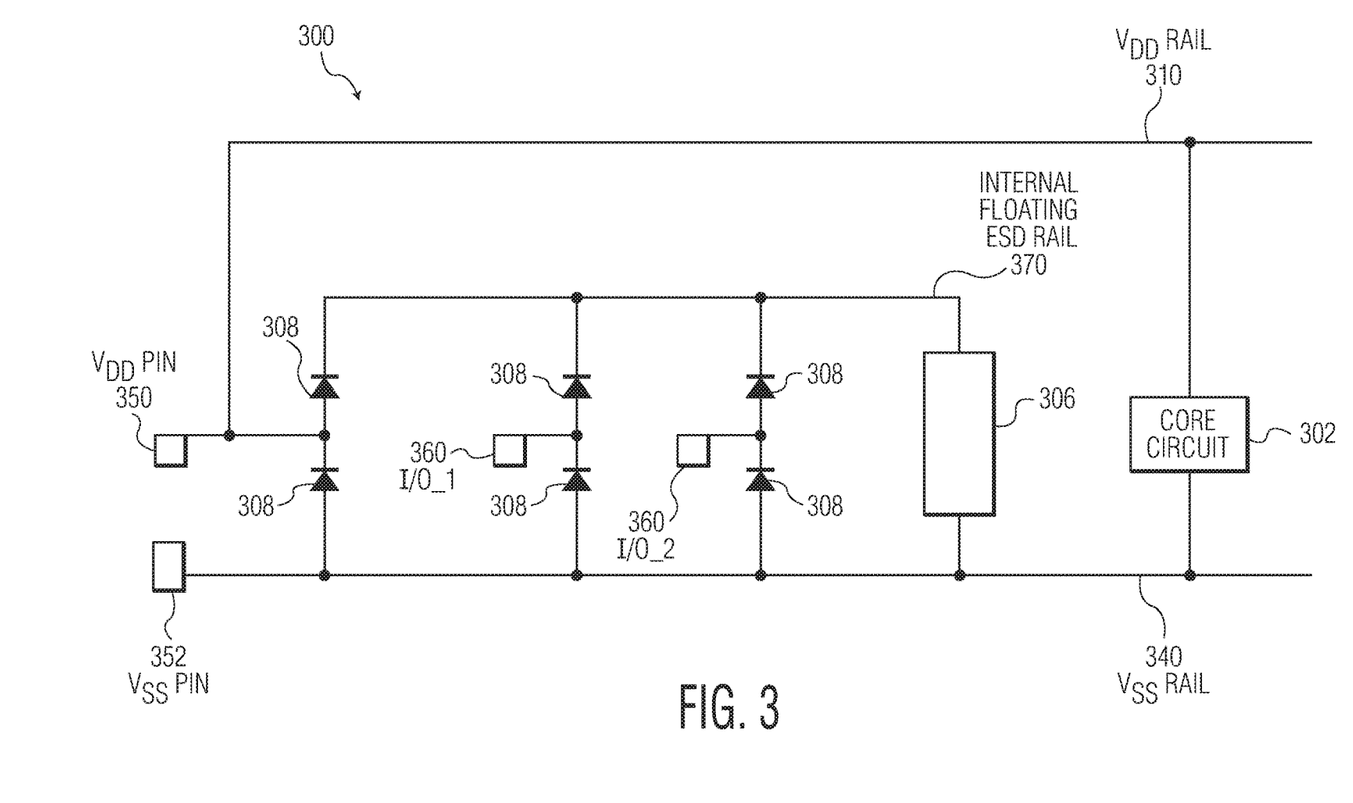
FIG. 3 depicts an example embodiment of an internal floating ESD rail-based ESD protection network.

An alternative to known rail-based ESD protection networks as described with reference to FIG. 2 is an "internal floating ESD rail-based ESD protection network." FIG. 3 depicts an example embodiment of an internal floating rail-based ESD protection network 300. As shown in FIG. 3, the ESD protection network includes an internal floating ESD rail 370 that is located between the $V_{DD}$ rail 310 and the VSS rail 340 such that the internal floating ESD rail is not tied directly to the supply, $V_{DD}$, of the core circuit. Instead, the internal floating ESD rail is connected to the supply, $V_{DD}$, of the core circuit via two serially connected ESD diodes 308, similar to the I/O pins 360. Some electrical systems do not tolerate the presence of a diode directly between an I/O pin and the supply of an IC. For ICs that are used in this sort of system, the floating rail design can be used. A second advantage of the floating ESD rail-based design is that in ICs with several power domains, the different power domains can be powered up in random order.

An important difference between the rail-based ESD protection network 200 as shown in FIG. 2 and the internal floating ESD rail-based ESD protection network 300 as shown in FIG. 3 is that in the rail-based ESD design shown in FIG. 2, the ESD rail is part of the $V_{DD}$ domain, e.g., the $V_{DD}$ rail and the ESD rail are one and the same. In contrast, in an internal floating ESD rail-based design, the $V_{DD}$ domain is electrically separated from the ESD rail by an ESD diode. An advantage of the internal floating ESD rail-based design is that when the potential on the $V_{DD}$ pin is either zero or undefined, one of the I/O pins 360 can be pulled high by a different IC device in the same electrical system without the core circuit 302 drawing current. However, a drawback of the internal floating ESD rail-based design relates to unique electrical biasing that can exist in such a topology during normal circuit operation, combined with the way that ESD diodes are typically constructed. The combination of the unique electrical biasing and the typical ESD diode structure can lead to an increased, and unwanted, electrical leakage current at the I/O pins and/or at the $V_{DD}$ pin.

As shown in FIG. 3, with an internal floating ESD rail-based ESD protection network 300, the internal floating ESD rail 370 of the ESD protection network is electrically connected to the $V_{DD}$ rail 310 through an ESD diode 308. At the same time, the rail clamp 306 that is connected between the internal floating ESD rail and the $V_{SS}$ rail 340 may draw a leakage current, and as a result, the electrical potential of the internal floating ESD rail will be one ESD diode voltage below $V_{DD}$. If $V_{DD}$ is absent and one or more of the I/O pins 360 are pulled high, the same biasing exists except that the leakage current is drawn from the I/O pin rather than from $V_{DD}$. The electric potential of the internal floating ESD rail is then one diode voltage below that of the I/O pin that is pulled high. In a non-floating rail-based design, such biasing will not exist during normal operation because the ESD rail and the $V_{DD}$ rail are the same, and the I/O pins are generally driven only between the potentials of $V_{DD}$ and $V_{SS}$.

Figure 4:
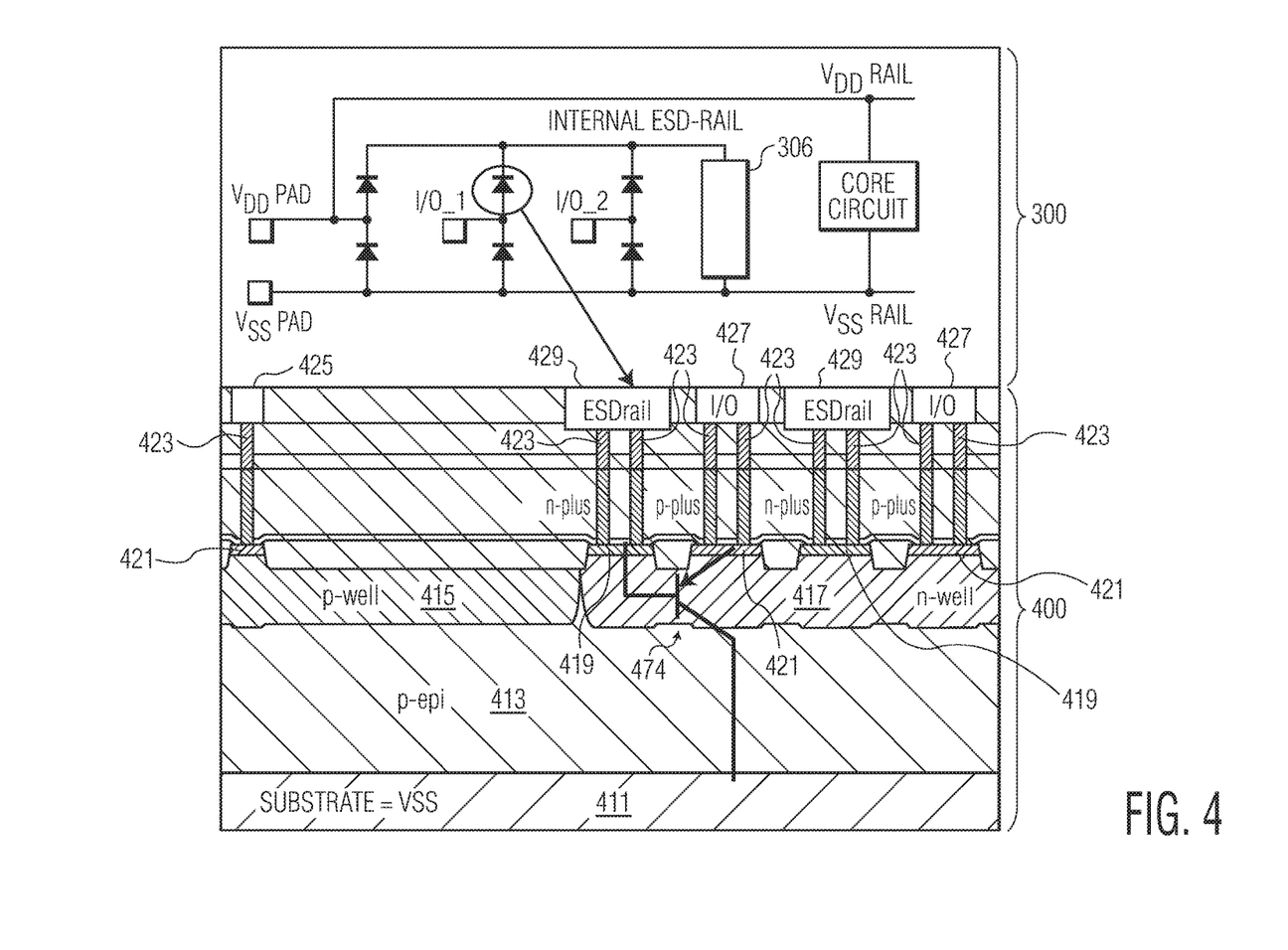
FIG. 4 depicts the internal floating ESD rail-based design of FIG. 3 relative to a side cutaway view of an integrated circuit device that includes the pins and ESD diodes of FIG. 3.

At the same time, the ESD diodes 308 between the I/O pins 360 and the internal floating ESD rail 370 typically consist of a p+ region and an n-well region that together form the diode (e.g., the n-well diode). Such as ESD diode also has a PNP bipolar junction transistor embedded in the diode as a parasite, where the p+ region connecting to the I/O pin acts as an emitter, the n-well region acts as a base, and the substrate and a surrounding p-well region act as collector. FIG. 4 depicts the internal floating ESD rail ESD protection system 300 of FIG. 3 relative to a side cutaway view of an integrated circuit device 400 that includes the pins and ESD diodes of FIG. 3. In particular, FIG. 4 depicts a substrate layer 411, a p-epi layer 413, a p-well region 415, an n-well region 417, n+ (n-plus) regions 419, p+ (p-plus) regions 421, vias 423, a $V_{SS}$ pin layer 425, I/O pin layers 427, and an internal floating ESD rail layer 429. FIG. 4 also illustrates the PNP bipolar junction transistor 474 embedded in an ESD diode as a parasite for the ESD diode. As illustrated, the PNP bipolar junction transistor can be biased in active forward mode during normal operation, resulting in increased pin leakage.

With reference to FIG. 4, the unique electrical biasing found in an internal floating ESD rail-based design may cause the parasitic PNP bipolar junction transistor 474 to be biased as a regular bipolar junction transistor, i.e., there is a forward electrical bias on the emitter-base junction. As a result, there is a collector current from the I/O pin 427, I/O_1, acting as an emitter, directly to the substrate 411 and to the surrounding p-well region 415, which both act as a collector. The collector current is seen as I/O pin leakage, or $V_{DD}$ leakage, at the pins of the IC device. The current may be equal to the leakage current drawn by the rail clamp 306, multiplied by the gain factor of the parasitic PNP, which can be on the order of 5 or 10. Particularly, at higher temperatures, the gain factor of the parasitic PNP can result in unacceptable leakage currents at the pins of the IC.

It should be noted that when the ESD protection features are activated during an ESD strike, the same parasitic PNP bipolar junction transistor is activated in both a rail-based ESD design and an internal floating ESD rail-based design. During an electrostatic discharge, however, having this parasitic PNP bipolar junction transistor activate is actually beneficial.

In accordance with an embodiment of the invention, an ESD protection circuit is disclosed. The ESD protection circuit is connected between a $V_{DD}$ rail and a $V_{SS}$ rail and includes an internal floating ESD rail located between the $V_{DD}$ rail and the $V_{SS}$ rail, I/O pins connected between the internal floating ESD rail and the $V_{SS}$ rail, ESD diodes corresponding to each I/O pin, with a first ESD diode located between the I/O pin and the internal floating ESD rail and a second ESD diode located between the I/O pin and the $V_{SS}$ rail, an internal bias cell corresponding to each I/O pin and configured to short the corresponding I/O pin to the internal floating ESD rail when the I/O pin is pulled high, and an internal bias cell corresponding to a $V_{DD}$ pin of the $V_{DD}$ rail and configured to short the $V_{DD}$ rail to the internal floating ESD rail when the $V_{DD}$ pin is pulled high. Utilizing such an ESD protection circuit, internal biasing that may result in increased pin leakage from activation of the parasitic PNP bipolar junction transistor is effectively eliminated, while at the same time, benefits that come with using an internal floating ESD rail-based design are preserved. In an embodiment of the ESD protection circuit, a metal oxide semiconductor (MOS) transistor, such as a pMOS transistor, is used to reduce or eliminate the potential difference between the $V_{DD}$ rail and the internal floating ESD rail, e.g., to short the $V_{DD}$ rail to the internal floating ESD rail. It has been found that reducing or eliminating the bias voltage is a very effective way of suppressing the PNP-induced leakage because bipolar currents vary exponentially with bias voltage, so even a small decrease in bias can result in one or more decades in leakage reduction.

Figure 5:
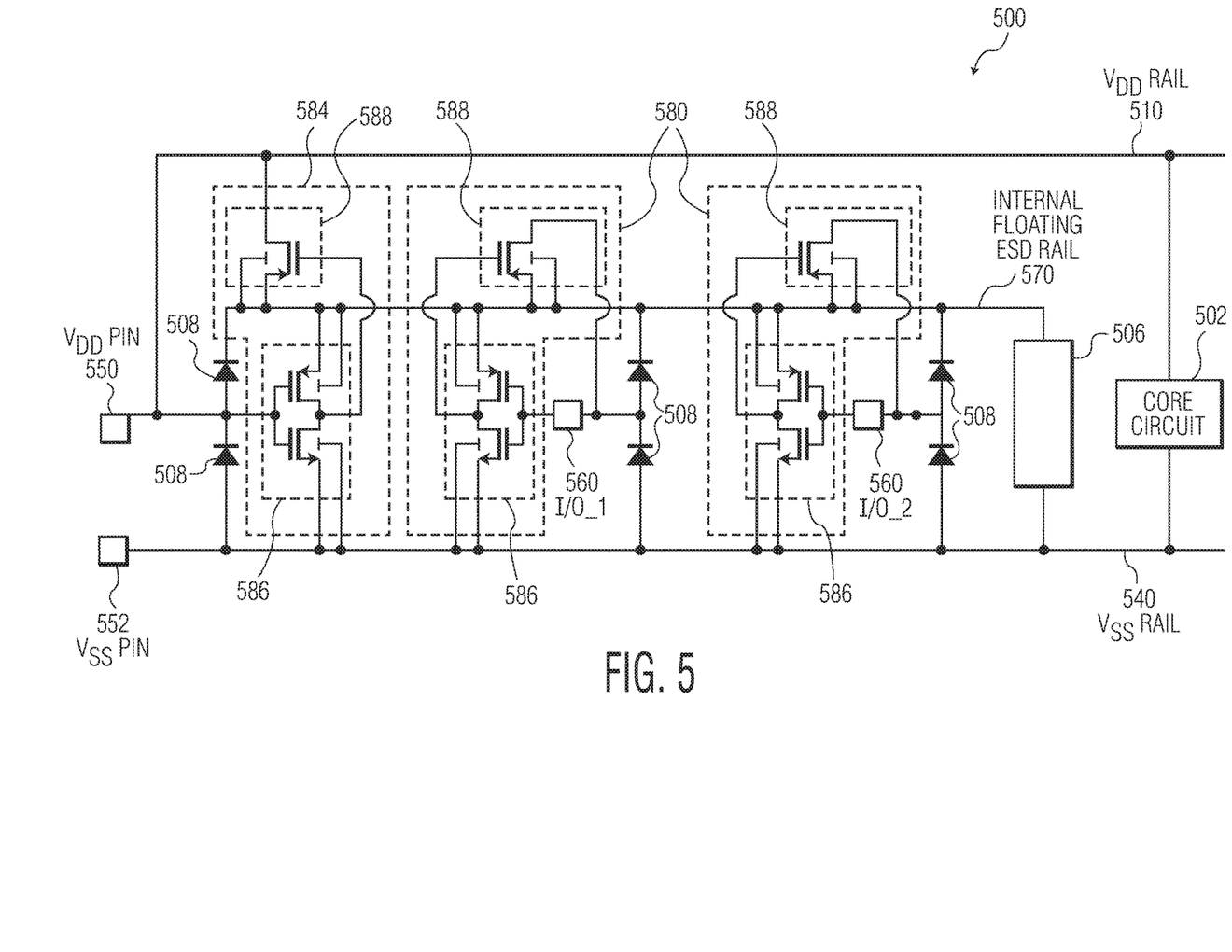
FIG. 5 depicts an embodiment of an ESD protection circuit that includes internal bias cells in accordance with an embodiment of the invention.

FIG. 5 depicts an embodiment of an ESD protection network 500 that includes an ESD protection circuit connected between a $V_{DD}$ rail 510 and a $V_{SS}$ rail 540 that includes internal bias cells 580 and 584 corresponding to the I/O pins 560 and to the $V_{DD}$ pin 550 that are configured to reduce or eliminate the bias voltage to suppress PNP-induced leakage at pins of a corresponding IC device. Each bias cell corresponding to the I/O pins includes an inverter 586 connected between the internal floating ESD rail 570 and the $V_{SS}$ rail and a transistor 588 connected between the internal floating ESD rail and the corresponding I/O pin. In the embodiment of FIG. 5, the transistor is a pMOS transistor and the inverter includes a pMOS transistor and an nMOS transistor, and is sometimes referred to as a "static CMOS inverter." The input of the inverter is connected to the corresponding I/O pin and the output of the inverter is connected to the gate of the corresponding transistor. The internal bias cell corresponding to each I/O pin is configured to short the corresponding I/O pin to the internal floating ESD rail when the I/O pin is pulled high. For example, the inverter 586 corresponding to an I/O pin enables the corresponding transistor 588 (e.g., causes the transistor to be conducting) when the I/O pin voltage is higher than the voltage of the internal floating ESD rail and the same inverter disables the corresponding transistor (e.g., causes the transistor to be non-conducting) when the I/O pin voltage is lower than the voltage of the internal floating ESD rail. The bias cell corresponding to the $V_{DD}$ pin includes an inverter connected between the internal floating ESD rail and the $V_{SS}$ rail and a transistor connected between the $V_{DD}$ rail and the internal floating ESD rail. The input of the inverter is connected to the $V_{DD}$ pin and the output of the inverter is connected to the gate of the corresponding transistor. The internal bias cell corresponding to the $V_{DD}$ pin is configured to short the $V_{DD}$ rail to the internal floating ESD rail when the $V_{DD}$ pin is pulled high. For example, the inverter 586 corresponding to the $V_{DD}$ pin enables the corresponding transistor 588 (e.g., causes the transistor to be conducting) when the I/O pin voltage is higher than the voltage of the internal floating ESD rail and the same inverter disables the corresponding transistor (e.g., causes the transistor to be non-conducting) when the I/O pin voltage is lower than the voltage of the internal floating ESD rail.

In general, a function of the ESD protection circuit is to have each I/O pin 560 drive the corresponding inverter 586 as well as the signal that the corresponding I/O pin is meant to receive or transmit. Similarly, a function of the ESD protection circuit is to have the $V_{DD}$ pin 550 drive the corresponding inverter 586 as well as supply the circuits that are connected between the $V_{DD}$ pin and the $V_{SS}$ pin, e.g., ground. The corresponding inverter is supplied from the internal floating ESD rail 570. In its turn, the corresponding inverter drives the transistor 588 (e.g., a pMOS transistor) that is connected between the corresponding I/O pin and the internal floating ESD rail. When any of the pins is pulled high, the internal floating ESD rail will be one diode voltage below the pin itself. This ensures that the inverter is in any case supplied up to one diode voltage below the supply voltage, $V_{DD}$, and since the pin is pulled high, the inverter output is near $V_{SS}$ (e.g., low). As a result, the gate of the transistor is pulled down, which causes the transistor to conduct between the internal floating ESD rail and the I/O pin. Depending on the size of the transistor, the transistor acts either as a hard short, or as a resistive short. In either case, the voltage difference between the internal floating ESD rail and the I/O pin is less than the 0.6 V it would be if only the ESD diode 508 were to connect between the I/O pin and the internal floating ESD rail. As a result, electrical biasing that tends to activate the parasitic PNP bipolar junction transistor in the ESD diode is reduced or eliminated and thus, the parasitic PNP does not cause any increased pin leakage. In the ESD protection network 500, the internal floating ESD rail being at a higher potential relative to the I/O pins via the internal bias cells ensures that there is not a leakage path from the I/O pins to the rail clamp via the corresponding ESD diodes. In operation, the internal floating ESD rail will track the maximum potential at the VDD pin or at any of the I/O pins, whichever is higher.

If during the process of pulling a given I/O pin high (e.g., assume I/O_1), another I/O pin is low (e.g., assume I/O_2), the input of the inverter 586 corresponding to the I/O pin, I/O_2, is low also, meaning that the output of the inverter is at the potential of the internal floating ESD rail 570. As the potential of the gate and the source of the transistor 588 are now equal, the transistor does not conduct, and there is no electrical connection between the I/O pin, I/O_2, and the internal floating ESD rail other than the ESD diode 508, which a conventional internal floating ESD rail-based design would also have. Therefore, the I/O pin, I/O_1, will not start supplying current into the I/O pin, I/O_2, through the ESD protection network.

If during the process of pulling the I/O pin, I/O_1 high, the I/O pin, I/O_2, is already high, then the input of the inverter 586 of the I/O pin, I/O_2, is high, and the output of the inverter is low, and the transistor 588 in the bias cell corresponding to I/O pin, I/O_2, shorts the internal floating ESD rail 570 to the I/O pin, I/O_2. Pulling the I/O pin, I/O_1, high as well will result in a second short between the I/O pin, I/O_1, and the internal floating ESD rail, and with that, a short between the I/O pin, I/O_1, and the I/O pin, I/O_2 will also exist. However, so long as the I/O pin, I/O_1, and the I/O pin, I/O_2, are toggled between the $V_{DD}$ rail and the $V_{SS}$ rail as logic signals, potentially harmful cross-currents between I/O_1 and I/O_2 can be avoided.

If one of the I/O pins 560 is pulled from high to low, the input of the corresponding inverter 586 is pulled low as well, which causes the output of the inverter to be high so long as any of the other I/O pins remains high, which causes the transistor 588 to stop conducting. In an embodiment, the signal applied to the I/O pin should have sufficient drive strength to pull the pin low against the action of the (still activated) transistor that tries to pull the I/O pin up towards the internal floating ESD rail. For this reason, the drive strength of the transistor between the pin and the internal floating ESD rail should be chosen carefully, for example, the drive strength of the transistor should deliver just enough current to supply the leakage current drawn by the rail clamp so that the internal bias between the I/O pins and the internal floating ESD rails is less than approximately 0.6 V. At the same time, the drive strength of the transistor should be weak enough that external signals can still pull the pin down while other pins are held high.

Figure 6:
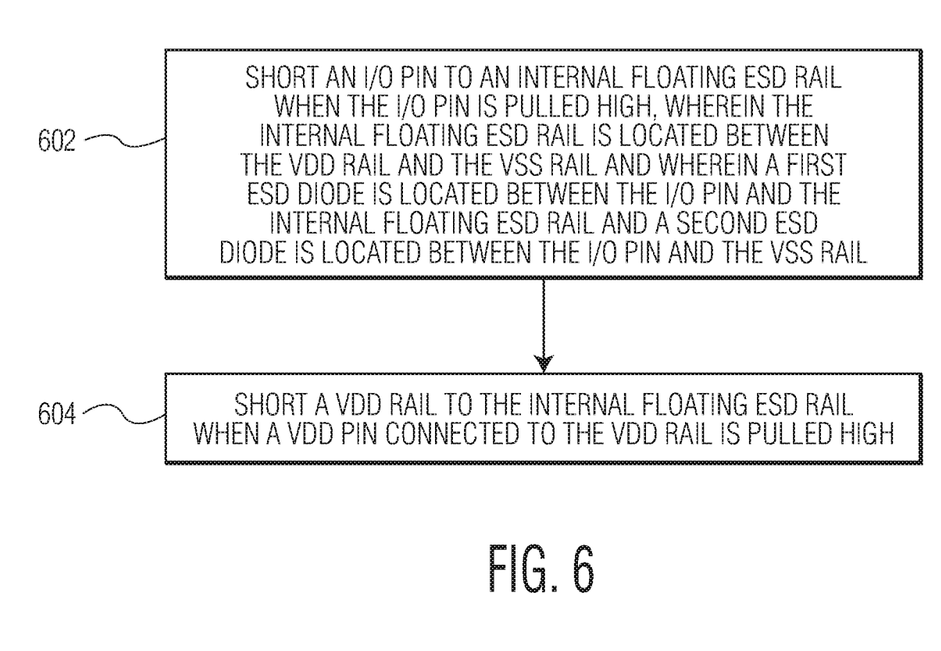
FIG. 6 is a process flow diagram of a method for providing ESD protection in accordance with an embodiment of the invention.

FIG. 6 is a process flow diagram of a method for providing ESD protection in a circuit that includes a $V_{DD}$ rail and a $V_{SS}$ rail. At block 602, an I/O pin is shorted to an internal floating ESD rail when the I/O pin is pulled high, wherein the internal floating ESD rail is located between the $V_{DD}$ rail and the $V_{SS}$ rail and wherein a first ESD diode is located between the I/O pin and the internal floating ESD rail and a second ESD diode is located between the I/O pin and the $V_{SS}$ rail. At block 604, a $V_{DD}$ rail is shorted to the internal floating ESD rail when a $V_{DD}$ pin connected to the $V_{DD}$ rail is pulled high. In an embodiment, the above-described method can be implemented using the ESD protection circuit described above with reference to FIG. 5.

The above-described ESD protection technique may provide several benefits. For example, the above-described ESD protection technique utilizes pMOS transistors and nMOS transistors, which are operated in normal MOS mode, so the solution and its side effects can be simulated in circuit simulators. The above-described ESD protection technique utilizes small components (one inverter and one high resistance pMOS transistor), that are added to known internal floating ESD rail-based design. Such an ESD protection circuit is therefore relatively easy to implement within an existing design to address leakage, without having to change the entire design of the ESD circuit/network. The above-described ESD protection technique can reduce the internal bias of the parasitic PNP that causes unwanted leakage. The variation of this leakage current depends very strongly on this bias and is highly non-linear, meaning that a small decrease in bias can produce a very strong reduction in leakage.

The ESD protection circuit and corresponding ESD protection technique are applicable to systems that use an internal floating ESD rail in combination with low pin leakage requirements. Specific examples of applications include low-voltage data switches for mobile applications, or the analog, low voltage block of data switches for mobile applications.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. An electrostatic discharge (ESD) protection circuit connected between a VDD rail and a VSS rail, the ESD protection circuit comprising:
   an internal floating ESD rail located between the VDD rail and the VSS rail;
   input/output (I/O) pins connected between the internal floating ESD rail and the VSS rail;
   ESD diodes corresponding to at least one I/O pin, with a first ESD diode located between the I/O pin and the internal floating ESD rail and a second ESD diode directly connecting the I/O pin to the VSS rail;
   an internal bias cell corresponding to at least one I/O pin and configured to short the corresponding I/O pin to the internal floating ESD rail when the I/O pin is pulled high; and
   an internal bias cell corresponding to a VDD pin of the VDD rail and configured to short the VDD rail to the internal floating ESD rail when the VDD pin is pulled high.

2. The ESD protection circuit of claim 1,
   wherein the internal bias cell corresponding to an I/O pin comprises a transistor connected between the I/O pin and the internal floating ESD rail.

3. The ESD protection circuit of claim 2,
   wherein the internal bias cell corresponding to an I/O pin comprises an inverter having an input connected to the I/O pin and an output connected to a gate of the transistor.

4. The ESD protection circuit of claim 3,
   wherein the inverter is connected between the internal floating ESD rail and the VSS rail.

5. The ESD protection circuit of claim 4,
   wherein the transistor comprises a pMOS transistor and the inverter comprises an nMOS transistor and a pMOS transistor.

6. The ESD protection circuit of claim 1,
   wherein the internal bias cell corresponding to the VDD pin comprises a transistor connected between the VDD rail and the internal floating ESD rail.

7. The ESD protection circuit of claim 6,
   wherein the internal bias cell corresponding to the VDD pin comprises an inverter having an input connected to the VDD pin and an output connected to a gate of the transistor.

8. The ESD protection circuit of claim 7,
   wherein the inverter is connected between the internal floating ESD rail and the VSS rail.

9. The ESD protection circuit of claim 8,
   wherein the transistor comprises a pMOS transistor and the inverter comprises an nMOS transistor and a pMOS transistor.

10. The ESD protection circuit of claim 1,
    wherein the internal bias cell corresponding to an I/O pin comprises a first transistor connected between the I/O pin and the internal floating ESD rail and
    wherein the internal bias cell corresponding to the VDD pin comprises a second transistor connected between the VDD rail and the internal floating ESD rail.

11. The ESD protection circuit of claim 10,
    wherein the internal bias cell corresponding to an I/O pin comprises an inverter having an input connected to the I/O pin and an output connected to a gate of the first transistor and
    wherein the internal bias cell corresponding to the VDD pin comprises an inverter having an input connected to the VDD pin and an output connected to a gate of the second transistor.

12. The ESD protection circuit of claim 11,
    wherein the inverter of the internal bias cell corresponding to an I/O pin is connected between the internal floating ESD rail and the VSS rail and
    wherein the inverter of the internal bias cell corresponding to the VDD pin is connected between the internal floating ESD rail and the VSS rail.

13. The ESD protection circuit of claim 12, wherein
    within the internal bias cell corresponding to an I/O pin, the first transistor comprises a pMOS transistor and the inverter comprises an nMOS transistor and a pMOS transistor and
    within the internal bias cell corresponding to the VDD pin, the second transistor comprises a pMOS transistor and the inverter comprises an nMOS transistor and a pMOS transistor.

14. A method for providing electrostatic discharge (ESD) protection in a circuit that includes a VDD rail and a VSS rail, the method comprising:
    shorting an I/O pin to an internal floating ESD rail when the I/O pin is pulled high,
    wherein the internal floating ESD rail is located between the VDD rail and the VSS rail and wherein a first ESD diode is located between the I/O pin and the internal floating ESD rail and a second ESD diode is directly connecting the I/O pin to the VSS rail; and shorting a VDD rail to the internal floating ESD rail when a VDD pin connected to the VDD rail is pulled high.

15. The method of claim 14, wherein shorting an I/O pin to the internal floating ESD rail when the I/O pin is pulled high comprises pulling down a gate of a transistor connected between the I/O pin and the internal floating ESD rail, which causes the transistor to conduct between the internal floating ESD rail and the I/O pin.

16. The method of claim 15, wherein shorting the I/O pin to the internal floating ESD rail when the I/O pin is pulled high comprises pulling an input of an inverter high, wherein the input is connected to the I/O pin and an output of the inverter is connected to the gate of the transistor.

17. The method of claim 14, wherein shorting the VDD rail to the internal floating ESD rail when the VDD pin is pulled high comprises pulling down a gate of a transistor connected between the VDD rail and the internal floating ESD rail, which causes the transistor to conduct between the VDD rail and the I/O pin.

18. The method of claim 17, wherein shorting VDD rail to the internal floating ESD rail when the VDD pin is pulled high comprises pulling an input of an inverter high, wherein the input is connected to the VDD pin and an output of the inverter is connected to the gate of the transistor.

19. The method of claim 14, wherein:

shorting an I/O pin to the internal floating ESD rail when the I/O pin is pulled high comprises pulling an input of an inverter high, wherein the input is connected to the I/O pin and an output of the inverter is connected to a gate of a first transistor that is connected between the I/O pin and the internal floating ESD rail and pulling down the gate of the first transistor; and shorting the VDD rail to the internal floating ESD rail when the VDD pin is pulled high comprises pulling an input of an inverter high, wherein the input is connected to the VDD pin and an output of the inverter is connected to a gate of a second transistor that is connected between the VDD rail and the internal floating ESD rail and pulling down the gate of the second transistor.

20. An electrostatic discharge (ESD) protection circuit connected between a VDD rail and VSS rail, the ESD protection circuit comprising:

means for shorting an I/O pin to an internal floating ESD rail when the I/O pin is pulled high, wherein the internal floating ESD rail is located between the VDD rail and the VSS rail and wherein a first ESD diode is located between the I/O pin and the internal floating ESD rail and a second ESD diode is located between the I/O pin and the VSS rail; and means for shorting a VDD rail to the internal floating ESD rail when a VDD pin connected to the VDD rail is pulled high.

21. An electrostatic discharge (ESD) protection circuit connected between a VDD rail and a VSS rail, the ESD protection circuit comprising:

an internal floating ESD rail located between the VDD rail and the VSS rail;

input/output (I/O) pins connected between the internal floating ESD rail and the VSS rail;

ESD diodes corresponding to at least one I/O pin, with a first ESD diode located between the I/O pin and the internal floating ESD rail and a second ESD diode located between the I/O pin and the VSS rail;

an internal bias cell corresponding to at least one I/O pin and configured to short the corresponding I/O pin to the internal floating ESD rail when the I/O pin is pulled high; and an internal bias cell corresponding to a VDD pin of the VDD rail and configured to short the VDD rail to the internal floating ESD rail when the VDD pin is pulled high wherein the internal bias cell corresponding to the VDD pin comprises a transistor connected between the VDD rail and the internal floating ESD rail.

22. A method for providing electrostatic discharge (ESD) protection in a circuit that includes a VDD rail and a VSS rail, the method comprising:

shorting an I/O pin to an internal floating ESD rail when the I/O pin is pulled high, wherein the internal floating ESD rail is located between the VDD rail and the VSS rail and wherein a first ESD diode is located between the I/O pin and the internal floating ESD rail and a second ESD diode is located between the I/O pin and the VSS rail; and shorting a VDD rail to the internal floating ESD rail when a VDD pin connected to the VDD rail is pulled high;

wherein shorting the VDD rail to the internal floating ESD rail when the VDD pin is pulled high comprises pulling down a gate of a transistor connected between the VDD rail and the internal floating ESD rail, which causes the transistor to conduct between the VDD rail and the I/O pin.

* * * * *